United States Patent [19]

Shiojima

[11] Patent Number: 4,598,426
[45] Date of Patent: Jul. 1, 1986

[54] VARIABLE INTERMEDIATE BANDWIDTH AM RECEIVER
[75] Inventor: Kazuo Shiojima, Tokyo, Japan
[73] Assignee: Trio Kabushiki Kaisha, Japan
[21] Appl. No.: 596,719
[22] Filed: Apr. 4, 1984
[30] Foreign Application Priority Data
Apr. 6, 1983 [JP] Japan .................................. 58-59375
[51] Int. Cl.$^4$ ............................................. H04B 1/16
[52] U.S. Cl. .................................... 455/266; 455/340
[58] Field of Search ........................ 455/200, 202–204, 455/266, 338–340; 329/129, 132, 135
[56] References Cited
U.S. PATENT DOCUMENTS
2,927,997 3/1960 Day ..................................... 455/266
4,124,817 11/1978 Takahashi ........................... 455/266
4,356,567 10/1982 Eguchi et al. ....................... 455/266

Primary Examiner—Jin F. Ng
Attorney, Agent, or Firm—Gerald J. Ferguson, Jr.

[57] ABSTRACT

There is provided an AM receiver in which the bandwidth of an intermediate frequency amplifier is continuously varied in accordance with the received field strength. This AM receiver includes a combining circuit for combining a first AM detection output A from a narrow band intermediate frequency amplifier and a second AM detection output B from a wide band intermediate frequency amplifier to produce an AM signal output of $A(1-a_M)+a_M B$ (where, $0 \leq a_M \leq 1$). By varying the coefficient $a_M$, the bandwidth of the intermediate frequency amplifier can be equivalently continuously varied between the wide band and narrow band.

2 Claims, 5 Drawing Figures

VARIABLE INTERMEDIATE BANDWIDTH AM RECEIVER

BACKGROUND OF THE INVENTION

1. Field of the Invention

The present invention relates to an AM receiver in which the bandwidth of an intermediate frequency band amplifier is equivalently variable.

2. Description of the Prior Art

Conventionally, in AM receivers, there are those which are constituted in such a manner that the bandwidth of an intermediate frequency (IF) amplifier can be switched between the wide bandwidth and the narrow bandwidth. For example as shown in FIG. 1, the AM receiver of this kind is provided with a wide bandwidth intermediate frequency (IF) amplifier 4 and a narrow bandwidth intermediate frequency (IF) amplifier 5 and is constituted in such a manner that an output of a radio frequency (RF) amplifier 1 is supplied to a frequency converter consisting of a mixing circuit 2 and a local oscillator 3 and is converted into an intermediate frequency signal; this intermediate frequency signal is supplied to the wide bandwidth IF amplifier 4; an output of the wide bandwidth IF amplifier 4 is supplied to a detector 6 through the narrow bandwidth IF amplifier 5 and is detected therein; the output of the wide bandwidth IF amplifier 4 is also directly supplied to a detector 7 and is detected therein; and either one of a detection output from the detector 6 and a detection output from the detector 7 is selected by selector means 8.

As described above, according to the conventional AM receiver, the wide and narrow bandwidths can be changed over by switching the selector means 8; however, it has such a drawback that it is impossible to select a bandwidth between the wide and narrow bandwidths.

In addition, as shown in FIG. 2, there is an AM receiver provided with selector means 8A which is switched in response to an external signal in place of the selector means 8, a DC component detecting circuit 11 to detect the DC component level in the output of the detector 6, and a comparator 12 to detect whether or not an output of the DC component detecting circuit 11 is not lower than a predetermined value, thereby switching the selector means 8A responsive to an output of the comparator 12.

In such an AM receiver as shown in FIG. 2, when the received signal strength is small, the narrow bandwidth is automatically selected, while when the received signal strength is large, the wide bandwidth is automatically selected. However, there is such a drawback that it is impossible to select a bandwidth between the narrow bandwidth and the wide bandwidth in accordance with the received signal strength.

SUMMARY OF THE INVENTION

The present invention was made in consideration of the above problem and it is an object of the invention to provide an AM receiver in which the bandwidth of an intermediate frequency amplifier is equivalently variable, thereby eliminating the above drawback.

The foregoing problem is solved according to the invention in an AM receiver provided with narrow band and wide band intermediate frequency amplifiers characterized by a circuit for combining a first AM output signal A from the narrow band amplifier with a second AM output signal B from the wide band amplifier to produce an AM output signal $A(1-a_M)+a_M B$ (where, $0 \leq a_M \leq 1$), the coefficient $a_M$ being variable.

A particular embodiment includes a circuit for detecting the level of intermediate frequency signal. The coefficient $a_M$ of the combining circuit is varied according to the detected signal level.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE PREFERRED EMBODIMENTS

First Embodiment

Figure 3:
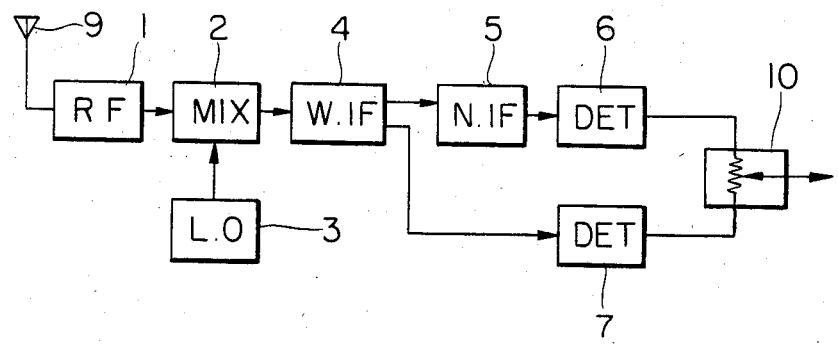
FIG. 3 is a block diagram showing a constitution of one embodiment of the present invention.

FIG. 3 is a block diagram showing a constitution of one embodiment of the present invention.

Constitution

Figure 1:
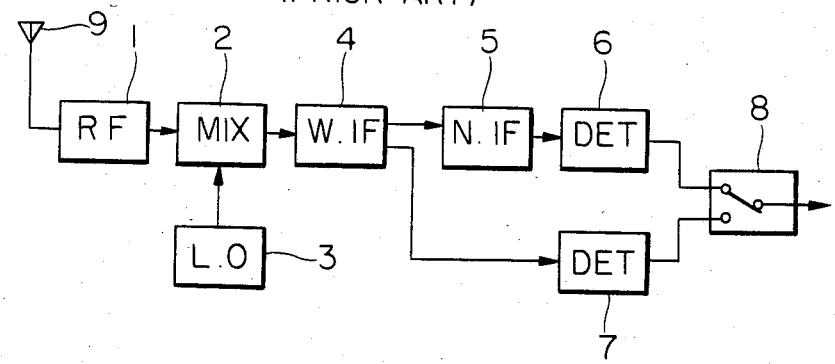
FIGS. 1 and 2 show block diagrams of a conventional AM receiver.

In FIG. 3, the same components and elements as those of the conventional AM receiver shown in FIG. 1 are designated by the same reference numerals.

In the embodiment as shown in FIG. 3, in place of the switch means 8 as shown in FIG. 1, an arithmetic operation circuit 10 is provided. The circuit 10 combines the output of the wide bandwidth IF amplifier 4 and the output of the narrow bandwidth IF amplifier 5 at a coefficient $a_M$ (where, $0 \leq a_M \leq 1$), and outputs a result of the combination. The coefficient $a_M$ is varied manually. It is assumed that the outputs of the amplifiers 4 and 5 are A and B, respectively. An output of the arithmetic operation circuit is supplied to the next stage as a detection output.

The arithmetic operation circuit 10 consists of, for instance, a variable resistor and the output of the detector 6 is supplied to one end of a resistor of the variable resistor, while the output of the detector 7 is supplied to the other end of the resistor thereof.

Operation

In one embodiment of the present invention constituted in such a manner as described above, the output signal from the radio frequency (RF) amplifier 1 is converted into the intermediate frequency signal by the frequency converter consisting of the mixing circuit 2 and the local oscillator 3. The IF signal thus converted is supplied to the wide bandwidth IF amplifier 4, so that the signal component in the pass band of the wide bandwidth IF amplifier 4 is outputted.

Figure 4:
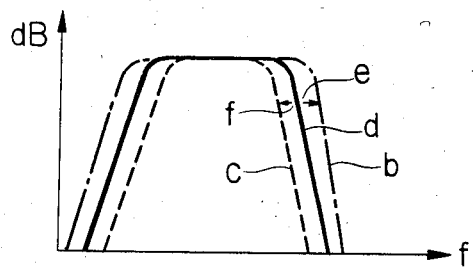
FIG. 4 shows a characteristic diagram to describe the action of one embodiment of the present invention.

It is now assumed that the amplitude vs frequency characteristic of the wide bandwidth IF amplifier 4 is as indicated by a curve b in FIG. 4. The output of the wide bandwidth IF amplifier 4 is supplied to the narrow bandwidth IF amplifier 5, so that the signal component in the pass band of the narrow bandwidth IF amplifier 5 is outputted. It is now assumed that the amplitude vs frequency characteristic of the narrow bandwidth IF amplifier 5 is as represented by a curve c in FIG. 4.

Therefore, the intermediate frequency, signal of the narrow band is supplied to the detector 6 and is detected therein, so that the narrow band detection output is obtained from the detector 6. On the other hand, the wide band intermediate frequency signal is supplied to the detector 7 and is detected therein, so that the wide band detection output is obtained from the detector 7.

The narrow band detection output A outputted from the detector 6 and the wide band detection output B outputted from the detector 7 are synthesized by the arithmetic operation circuit 10 and the operation of $A(1-a_M)+a_M B$ is executed, and the result of this operation is supplied as the detection output to the post stage. For example, when $a_M=0.6$, the AM output of $0.4A+0.6B$, i.e., the AM output of which the signals A and B were mixed at a ratio of 2:3 is obtained.

In this case, the equivalent pass bandwidth of the IF amplifier with respect to the output of the arithmetic operation circuit 10 is between the pass bandwidth of the wide bandwidth IF amplifier 4 and the pass bandwidth of the narrow bandwidth IF amplifier 5 and is as indicated by a curve d in FIG. 4. By changing the coefficient $a_M$ in the arithmetic operation circuit 10, for example, in the case where the arithmetic operation circuit 10 is constituted by a variable resistor, by changing the position of a slidable contact member of the variable resistor, it is possible to set the equivalent pass bandwidth into a value between the pass bandwidth of the wide bandwidth IF amplifier 4 and the pass bandwidth of the narrow bandwidth IF amplifier 5 as indicated by arrows e and f in FIG. 4.

Therefore, when the received signal strength is small or in the state in that the received signal is being subjected to disturbance, the equivalent pass bandwidth can be set into an intermediate bandwidth between the narrow bandwidth and the wide bandwidth; therefore, this enables an AM signal to be received with a good S/N ratio and a good frequency response.

Another embodiment of the present invention will now be described.

Second Embodiment

Figure 5:
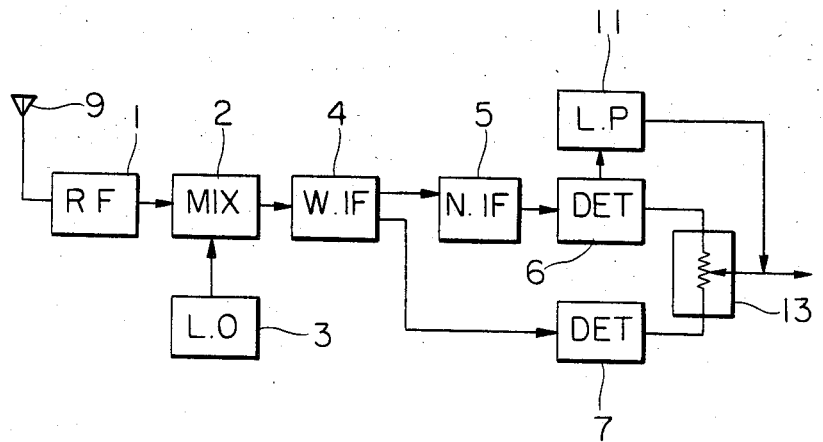
FIG. 5 is a block diagram showing a constitution of another embodiment of the present invention.

FIG. 5 is a block diagram showing a constitution of another embodiment of the present invention.

Constitution

Figure 2:
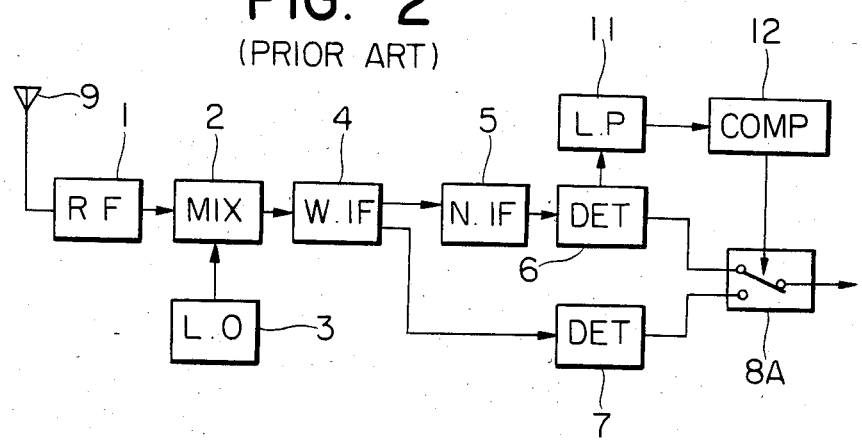

The same components and elements as those of the conventional AM receiver shown in FIGS. 1 and 2 are designated by the same reference numerals in FIG. 5.

In this another embodiment of the present invention, an arithmetic operation circuit 13 is provided in place of the switch means 8A; namely, this circuit 13 serves to calculate $A(1-a_M)+a_M B$ (where, $0\leq a_M \leq 1$), in which the coefficient $a_M$ is controlled in response to the output of the DC component detecting circuit 11 which receives the output of the detector 6 and detects the DC component level in the output of the detector 6. The arithmetic operation circuit 13 is set in such a manner that the coefficient $a_M$ increases as the output of the DC component detecting circuit 11 increases.

The arithmetic operation circuit 13 is constituted by, for example, an electronically controlled variable resistor of which the position of an equivalent slidable contact member is controlled using the output of the DC component detecting circuit 11 as the control signal, or a variable resistor consisting of a resistor having a plurality of centertaps and a multiplexer for selecting one tap among these centertaps in response to the output of the DC component detecting circuit 11, or the like.

Operation

In this embodiment of the present invention constituted as described above, the level of the intermediate frequency signal received is detected. The output of the narrow bandwidth IF amplifier 5 is detected by the detector 6 and the output of the detector 6 is supplied to the DC component detecting circuit 11, then the DC component level of the output of the detector 6 is detected by the DC component detecting circuit 11. This DC component level denotes a magnitude of the received signal.

The coefficient $a_M$ upon operation in the arithmetic operation circuit 13 increases in association with an increase in the output of the DC component detecting circuit 11, and an equivalent pass bandwidth of the IF amplifier for the output of the arithmetic operation circuit 13 increases and approaches the pass bandwidth of the wide bandwidth IF amplifier 4. On the other hand, with a decrease in the output of the DC component detecting circuit 11, the coefficient $a_M$ upon operation in the arithmetic operation circuit 13 decreases and an equivalent pass bandwidth of the IF amplifier for the output of the arithmetic operation circuit 13 decreases and approaches the pass bandwidth of the narrow bandwidth IF amplifier 5.

In this way, when the received signal strength is small, the output level of the DC component detecting circuit 11 is small, while when the received signal strength is large, the output level of the DC component detecting circuit 11 is large; therefore, when the received signal strength is small, the pass bandwidth is controlled to the narrow bandwidth side and when the received signal strength is large, it is controlled to the wide bandwidth side. Consequently, the detected output of the bandwidth corresponding to the received signal strength can be obtained.

In addition, as described above, in another embodiment of the present invention, the case has been exemplified where the coefficient $a_M$ of the arithmetic operation circuit 13 is controlled by supplying the output of the detector 6 to the DC component detecting circuit 11. However, the coefficient $a_M$ may be also controlled by supplying the output of the detector 7 to the DC component detecting circuit 11, and in this case, the arithmetic operation circuit 13 may be set in such a manner that the coefficient $a_M$ decreases in association with an increase in the output of the DC component detecting circuit 11.

On the other hand, in the conventional AM receiver shown in FIG. 2, when the output of the DC component detecting circuit 11 slightly changes about the switching level of the comparator 12, the selector circuit 8A enters the state in that the output of the detector 6 and the output of the detector 7 are alternately selected, so that a discontinuous feeling is exerted to a radio listener; however, such a discontinuous feeling is not exerted according to this embodiment of the present invention.

On one hand, although an example of the case where the wide bandwidth IF amplifier 4 and the narrow bandwidth IF amplifier 5 are connected in series has been described in the above embodiments of the present invention, a similar effect will be also obtained by supplying the output of the mixing circuit 2 to the detector 6 through the narrow bandwidth IF amplifier 5 and by supplying the output of the mixing circuit 2 to the detector 7 through the wide bandwidth IF amplifier 4.

As described above, according to the present invention, the bandwidth can be equivalently varied in accordance with the received signal strength, or the bandwidth can be automatically equivalently varied in response to the received signal strength; therefore, even when the received signal strength is an intermediate value, it is possible to perform the reception with a moderate S/N ratio and bandwidth.

What is claimed is:

1. An AM receiver comprising:

a narrow band intermediate frequency amplifier;

a first AM detector for detecting a signal from said narrow band amplifier to produce a first AM detection output signal A;

a wide band intermediate frequency amplifier;

a second AM detector for detecting a signal from said wide band amplifier to produce a second AM detection output signal B; and a circuit for combining said first and second AM detection output signals A and B at a coefficient $a_M$ to produce an AM detection output $A(1-a_M)+a_M B$, where, $0 \leq a_M \leq 1$), the coefficient $a_M$ being variable in said combining circuit.

2. An AM receiver according to claim 1, further including a circuit for detecting a magnitude of the received signal level from either said wide or narrow band intermediate frequency amplifier and wherein said coefficient $a_M$ is varied in response to an output of said detecting circuit.

* * * * *